United States Patent
Hou et al.

(10) Patent No.: US 12,329,037 B2
(45) Date of Patent: Jun. 10, 2025

(54) METHOD FOR FABRICATING SEMICONDUCTOR DEVICE

(71) Applicant: UNITED MICROELECTRONICS CORP., Hsin-Chu (TW)

(72) Inventors: Tai-Cheng Hou, Tainan (TW); Chau-Chung Hou, Tainan (TW); Da-Jun Lin, Kaohsiung (TW); Wei-Xin Gao, Tainan (TW); Fu-Yu Tsai, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 480 days.

(21) Appl. No.: 17/548,576

(22) Filed: Dec. 12, 2021

(65) Prior Publication Data

US 2023/0157180 A1    May 18, 2023

(30) Foreign Application Priority Data

Nov. 12, 2021  (CN) .......................... 202111338561.9

(51) Int. Cl.
| | |
|---|---|
| H10N 50/01 | (2023.01) |
| G11C 11/16 | (2006.01) |
| H01L 21/768 | (2006.01) |
| H01L 23/522 | (2006.01) |
| H10B 61/00 | (2023.01) |
| H10N 50/10 | (2023.01) |
| H10N 50/80 | (2023.01) |
| H10N 50/85 | (2023.01) |

(52) U.S. Cl.
CPC .......... H10N 50/01 (2023.02); G11C 11/161 (2013.01); H01L 21/7684 (2013.01); H01L 23/5226 (2013.01); H10B 61/00 (2023.02); H10N 50/10 (2023.02); H10N 50/80 (2023.02); H10N 50/85 (2023.02)

(58) Field of Classification Search
CPC ........ H10N 50/01; H10N 50/10; H10N 50/80; H10N 50/85; G11C 11/161; H01L 21/7684; H01L 23/5226; H10B 61/00
See application file for complete search history.

(56) References Cited

U.S. PATENT DOCUMENTS

| | | | |
|---|---|---|---|
| 2011/0201212 A1* | 8/2011 | Yamamoto | C23C 16/401 438/789 |
| 2017/0186683 A1* | 6/2017 | Lin | H01L 23/53228 |
| 2020/0006639 A1* | 1/2020 | Wu | H01L 21/28562 |
| 2020/0091419 A1* | 3/2020 | Yang | H10N 50/80 |
| 2020/0136014 A1* | 4/2020 | Wang | G11C 11/161 |
| 2020/0212290 A1* | 7/2020 | Wang | H10N 50/10 |
| 2021/0134668 A1* | 5/2021 | Huang | H10B 61/22 |
| 2021/0242277 A1* | 8/2021 | Dutta | H10N 50/80 |
| 2021/0305499 A1* | 9/2021 | Xie | H10N 50/10 |
| 2021/0336130 A1* | 10/2021 | Chien | H10N 50/01 |

* cited by examiner

Primary Examiner — Fernando L Toledo
Assistant Examiner — Marshall Mu-Nuo Hatfield
(74) Attorney, Agent, or Firm — Winston Hsu (57) ABSTRACT

A method for fabricating a semiconductor device includes the steps of forming a magnetic tunneling junction (MTJ) on a substrate, forming a first inter-metal dielectric (IMD) layer on the MTJ, removing part of the first IMD layer to form a damaged layer on the MTJ and a trench exposing the damaged layer, performing a ultraviolet (UV) curing process on the damaged layer, and then conducting a planarizing process to remove the damaged layer and part of the first IMD layer.

6 Claims, 7 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of forming a magnetic tunneling junction (MTJ) on a substrate, forming a first inter-metal dielectric (IMD) layer on the MTJ, removing part of the first IMD layer to form a damaged layer on the MTJ and a trench exposing the damaged layer, performing a ultraviolet (UV) curing process on the damaged layer, and then conducting a planarizing process to remove the damaged layer and part of the first IMD layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
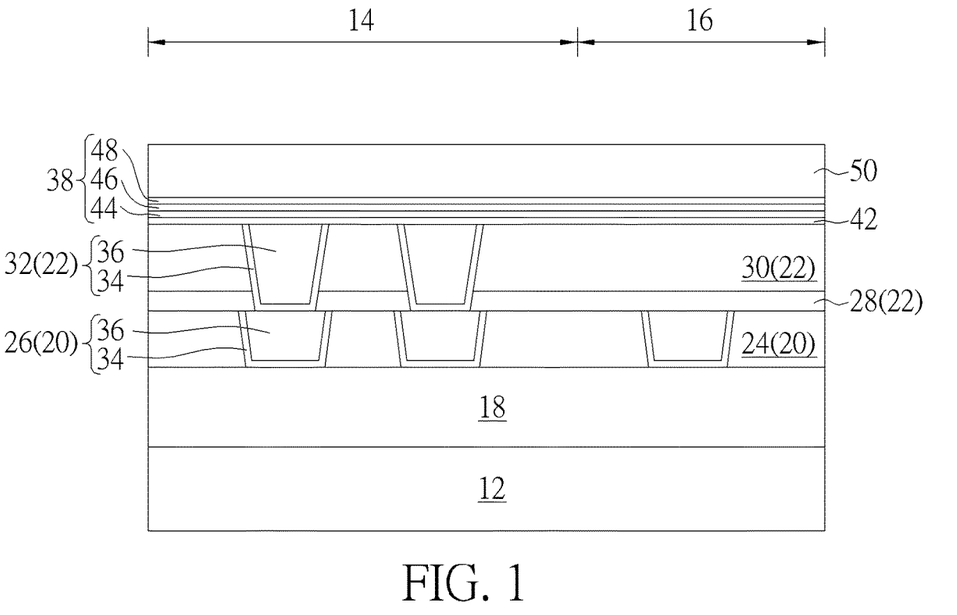
FIGS. 1-10 illustrate a method for fabricating a MRAM device according to an embodiment of the present invention.

Referring to FIGS. 1-10, FIGS. 1-10 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 are made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode 42 and the top electrode 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Alternatively, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
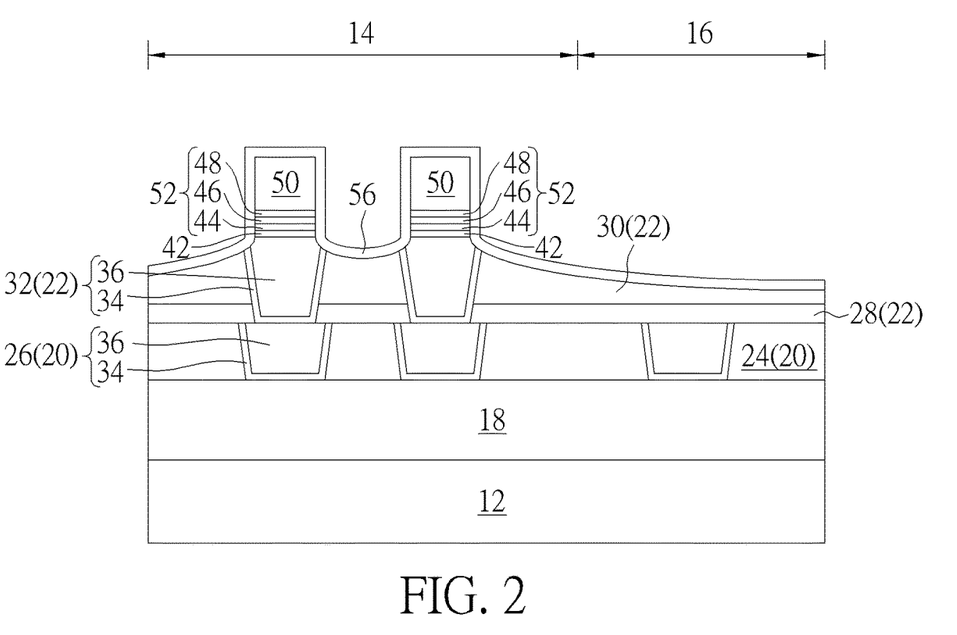

Next, as shown in FIG. 2, one or more etching process is conducted by using the patterned mask as mask to remove part of the top electrode 50, part of the MTJ stack 38, part of the bottom electrode 42, and part of the IMD layer 30 to form MTJs 52 on the MRAM region 14. It should be noted that a reactive ion etching (RIE) and/or an ion beam etching (IBE) process is conducted to remove the top electrode 50, MTJ stack 38, bottom electrode 42, and the IMD layer 38 in this embodiment for forming the MTJs 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52.

Next, a cap layer 56 is formed on the MTJs 52 while covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 3:
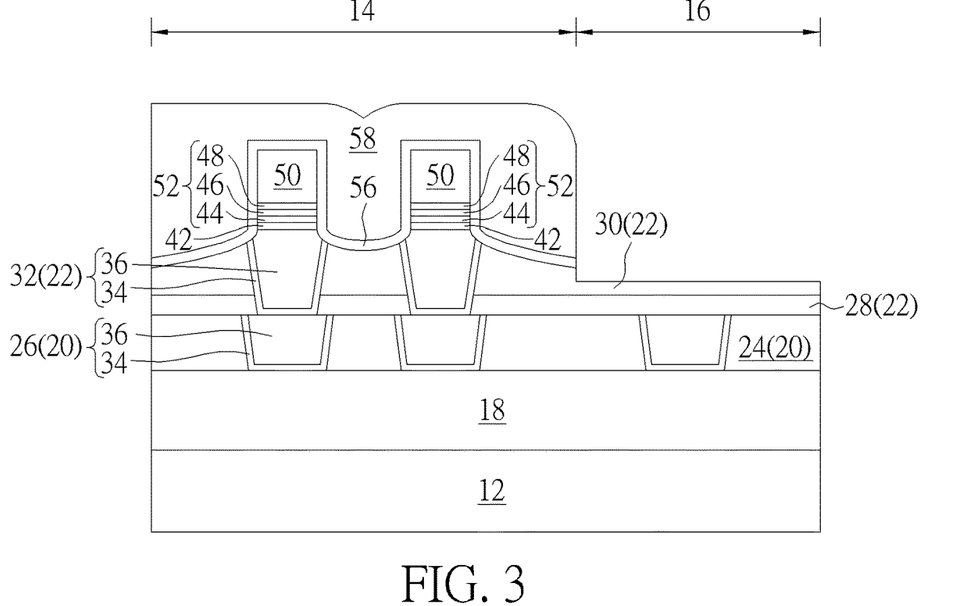

Next, as shown in FIG. 3, an atomic layer deposition (ALD) process is conducted to form a passivation layer 58 covering the MTJs 52 and the IMD layer 30 on the logic region 16, an etching back process is conducted to remove part of the passivation layer 58 on the MRAM region 14 and logic region 16 for forming a V-shape on the top surface of the passivation layer 58 between the two electrodes 50, and then another photo-etching process is conducted to remove the passivation layer 58, the cap layer 56, and part of the IMD layer 30 on the logic region 16. In this embodiment, the passivation layer 58 preferably includes silicon oxide, but not limited thereto.

It should be noted that after using the aforementioned etching process to remove part of the passivation layer 58, the top surface of the remaining passivation layer 58 is still slightly higher than the top surface of the two top electrodes 50 at a distance about 300-500 Angstroms and a V-shape is also formed on the top surface of the passivation layer 58 on the MRAM region 14 at the same time, in which the V-shape is between the two top electrodes 50, the valley point of the V-shape is higher than the top surface of the top electrodes 50, and the angle of the V-shape is greater than 110 degrees or more preferably greater than 120 degrees.

Figure 4:
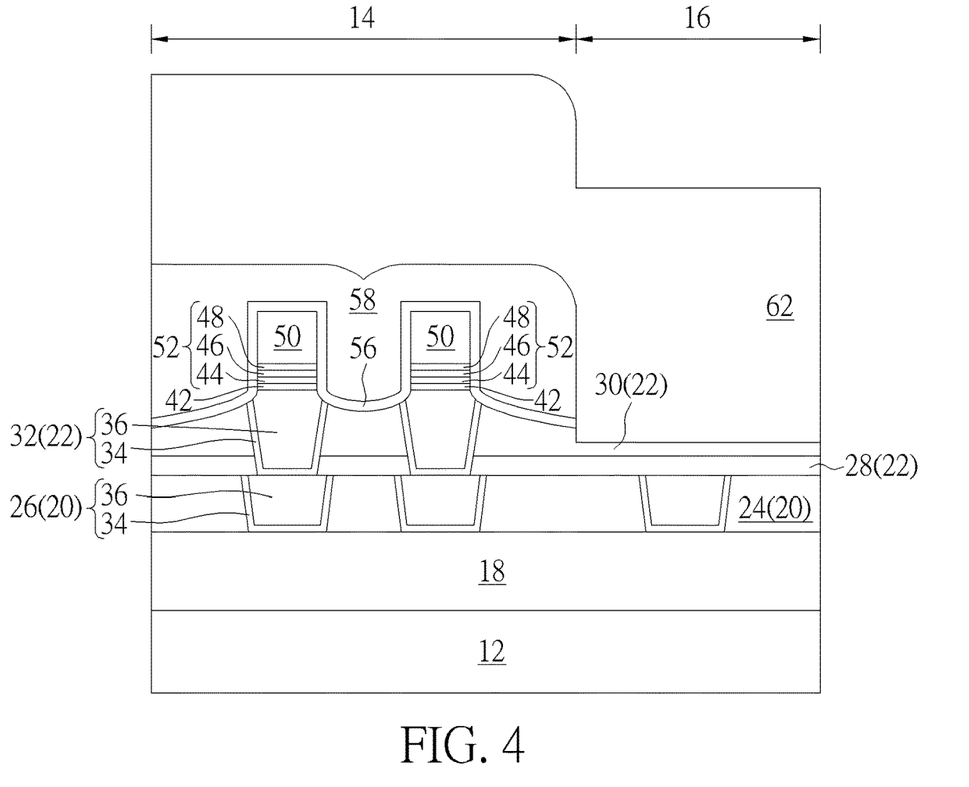

Next, as shown in FIG. 4, a flowable chemical vapor deposition (FCVD) process is conducted to form an intermetal dielectric (IMD) layer 62 on the passivation layer 58. In this embodiment, the IMD layer 62 preferably include an ultra low-k (ULK) dielectric layer including but not limited to for example porous material or silicon oxycarbide (SiOC) or carbon doped silicon oxide (SiOCH). It should be noted that after the IMD layer 62 is formed the top surface of the IMD layer 62 on the lotic region 16 is preferably lower than the top surface of the IMD layer 62 on the MRAM region 14 to form a step height.

Figure 5:
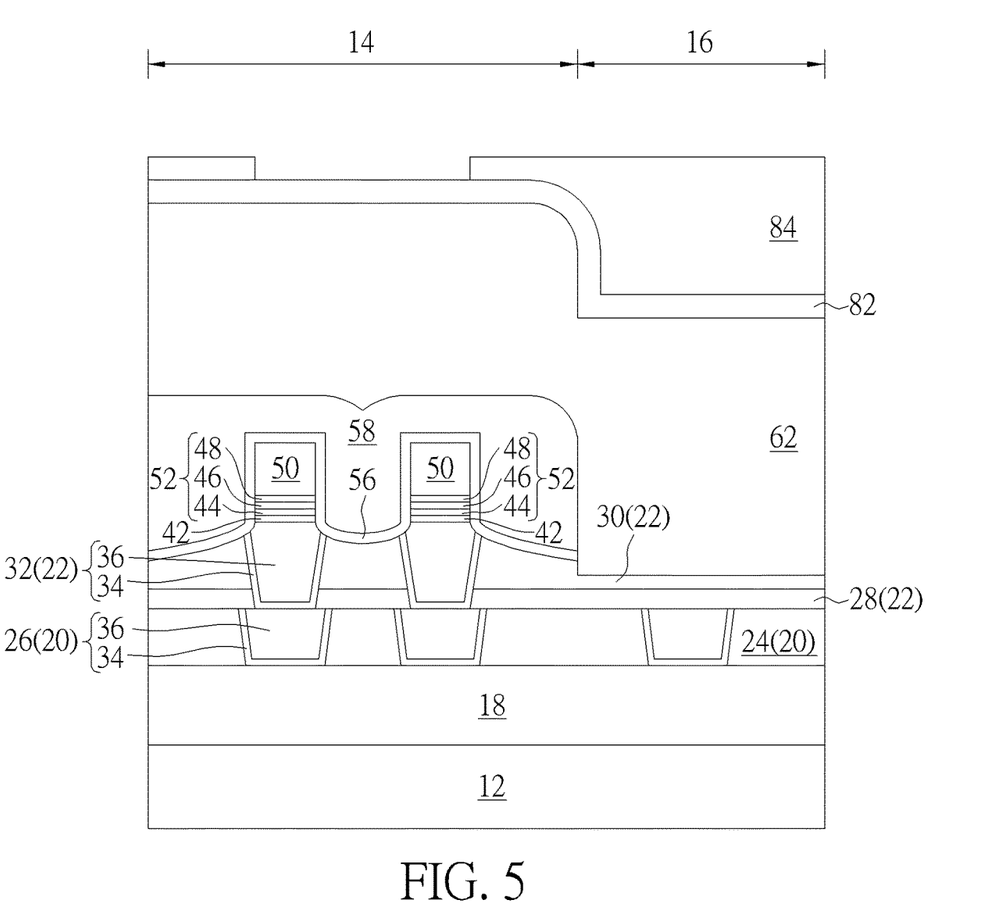

Next, as shown in FIG. 5, a reflective layer 82 is formed on the surface of the IMD layer 62 on the MRAM region 14 and logic region 16, and then a patterned mask 84 such as patterned resist is formed on the reflective layer 82, in which the patterned mask 84 includes an opening exposing the surface of the reflective layer 82. In this embodiment, the reflective layer 82 preferably includes metal or metal nitride such as tantalum (Ta) or tantalum nitride (TaN).

Figure 6:
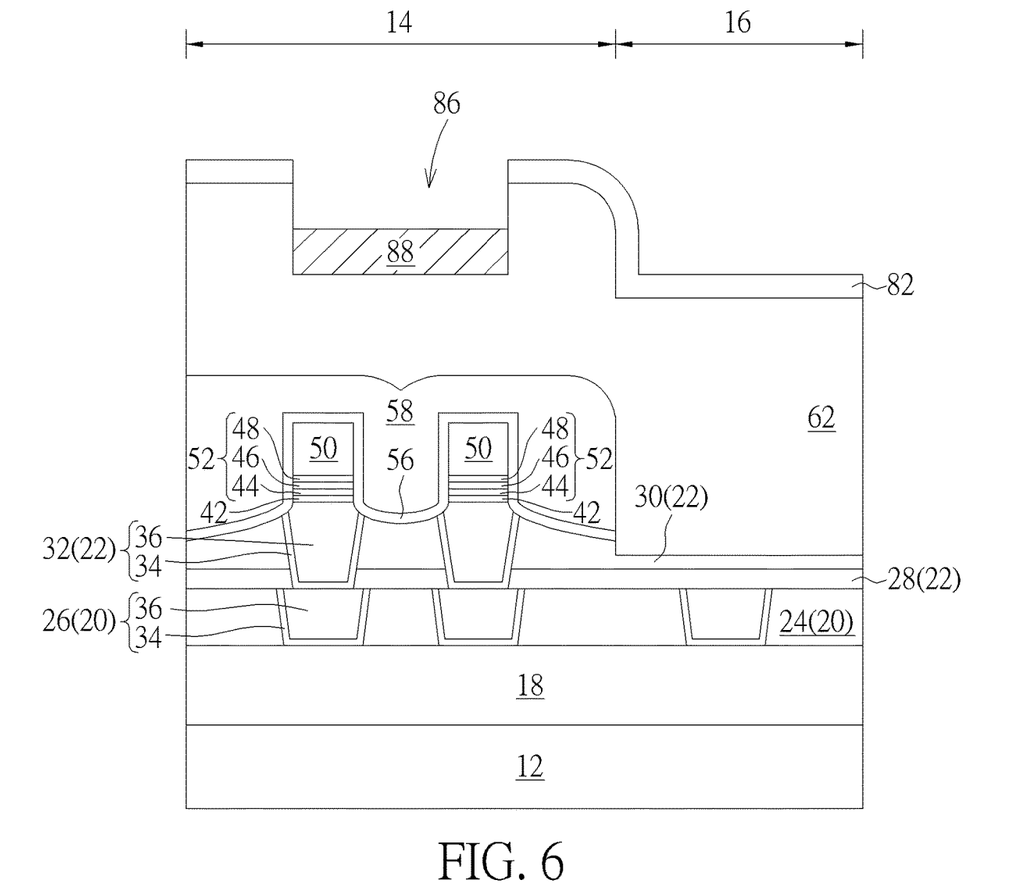

Next, as shown in FIG. 6, an etching process is conducted by using the patterned mask 84 as mask to remove part of the reflective layer 82 and part of the IMD layer 62 form forming a trench 86, and the patterned mask 84 is removed thereafter. It should be noted when part of the reflective layer 82 and part of the IMD layer 62 are removed by the etching process, part of the IMD layer 62 is transformed at the same time into a damaged layer 88 as the surface of the damaged layer 88 is exposed by the trench 86.

Figure 7:
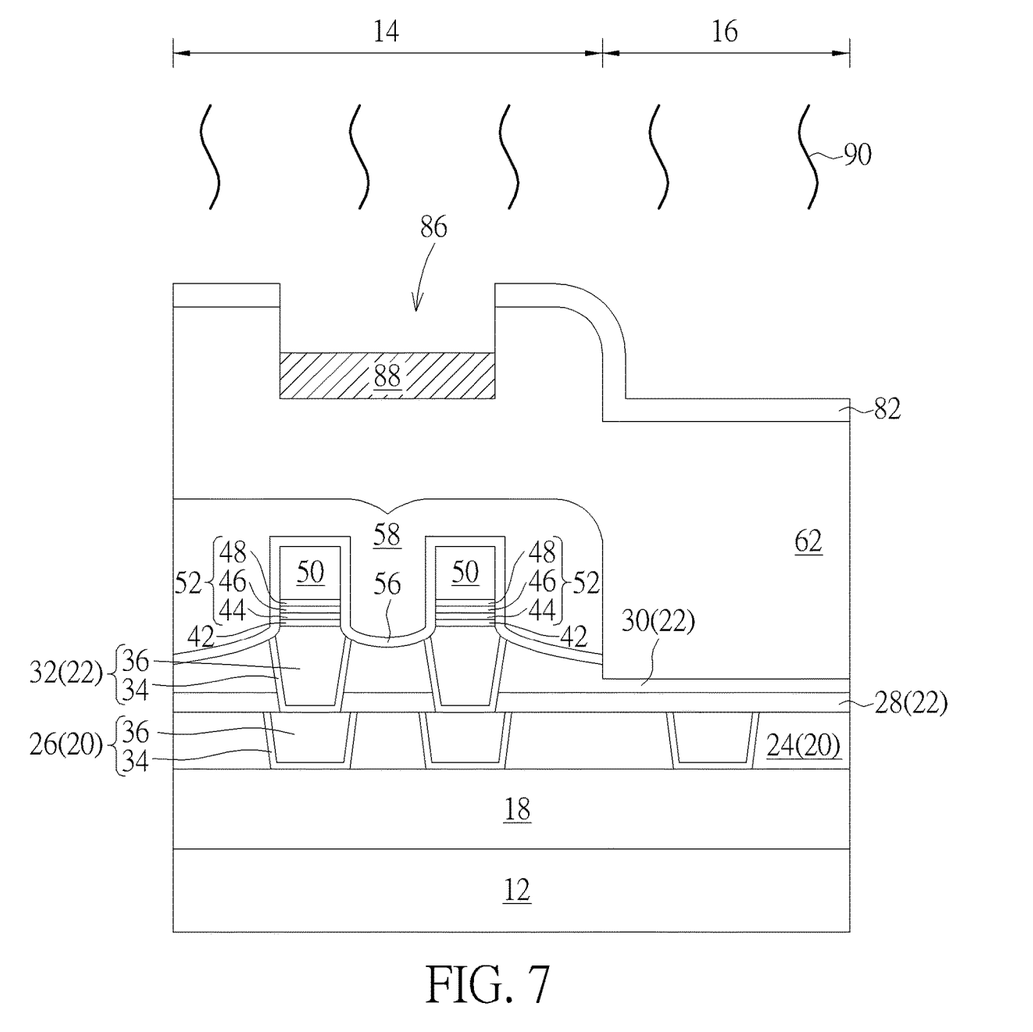

Next, as shown in FIG. 7, an ultraviolet (UV) curing process 90 is conducted to remove the methyl group ($CH_3$) bonds within the damaged layer 88 so that the damaged layer 88 would become slightly hardened. By doing so, it would be desirable to evenly planarize the damaged layer 88 and IMD layer 62 afterwards and also prevent collapse of the damaged layer 88 during the planarizing process.

Figure 8:
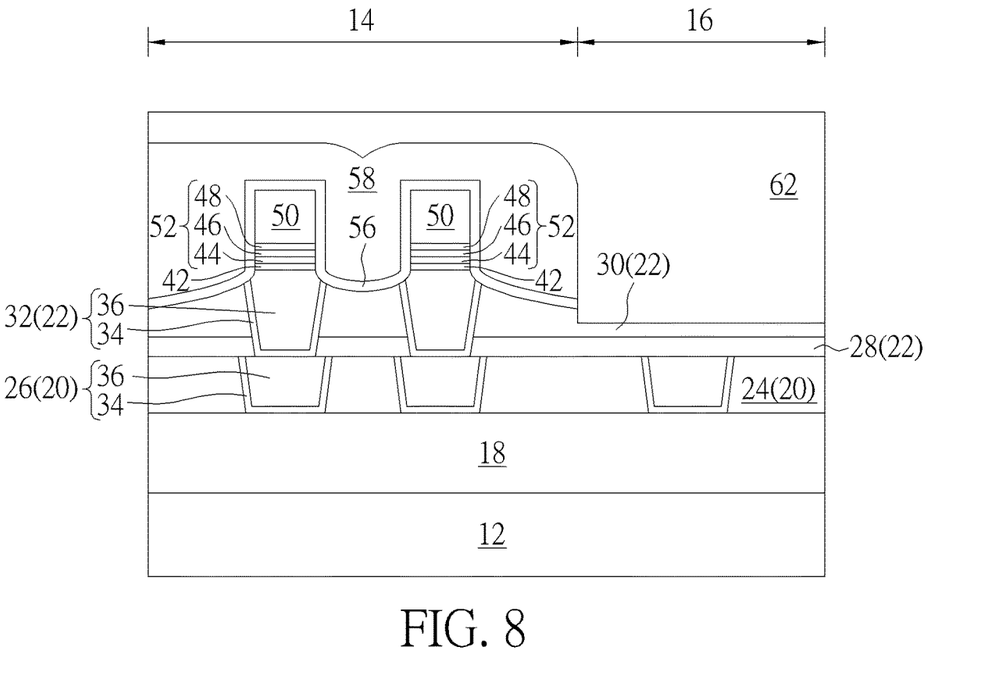

Next, as shown in FIG. 8, a planarizing process such as chemical mechanical polishing (CMP) is conducted to remove all of the reflective layer 82, all of the damaged layer 88, and part of the IMD layer 62 on the MRAM region 14 and logic region 16 so that the top surface of the IMD layer 62 on the MRAM region 14 is even with the top surface of the IMD layer 62 on the logic region 16.

Figure 9:
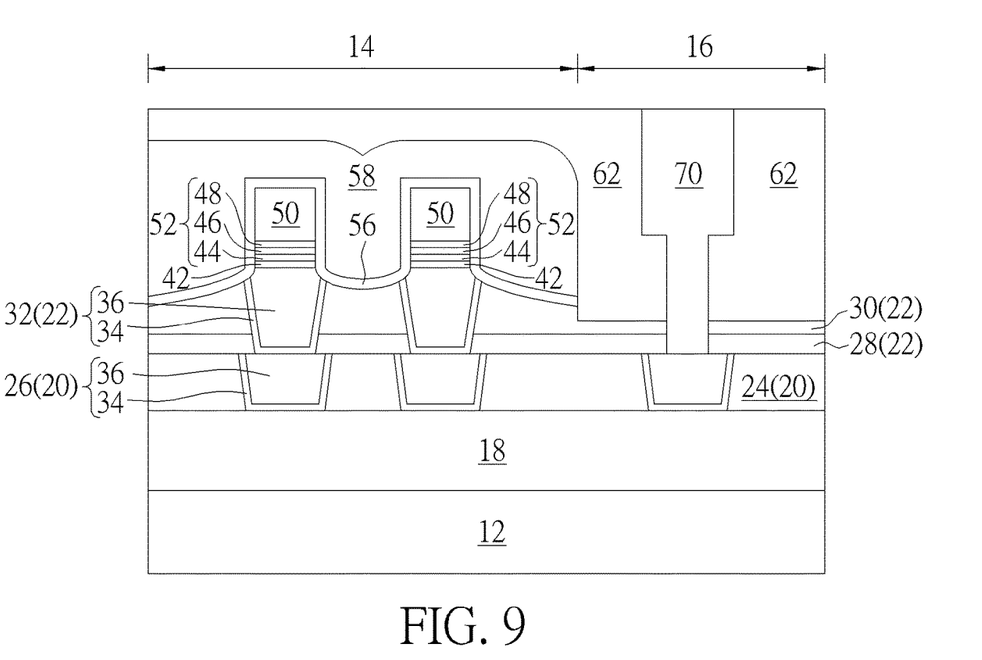

Next, as shown in FIG. 9, a pattern transfer process is conducted by using a patterned mask (not shown) to remove part of the IMD layer 62, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 70 in the contact hole electrically connecting the metal interconnection 26.

Figure 10:
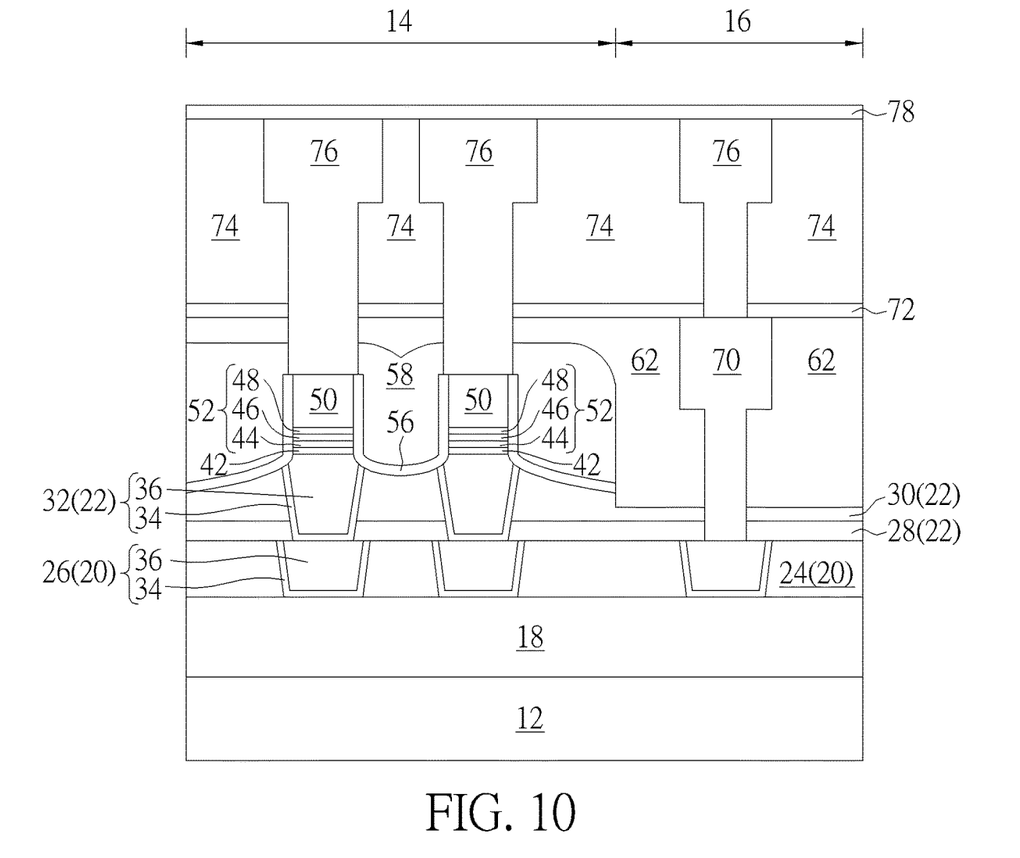

Next, as shown in FIG. 10, a stop layer 72 is formed on the MRAM region 14 and logic region 16 to cover the IMD layer 62 and metal interconnection 70, an IMD layer 74 is formed on the stop layer 72, and one or more photo-etching process is conducted to remove part of the IMD layer 74, part of the stop layer 72, part of the IMD layer 62, part of the passivation layer 58, and part of the cap layer 56 on the MRAM region 14 and logic region 16 to form contact holes (not shown). Next, conductive materials are deposited into each of the contact holes and a planarizing process such as CMP is conducted to form metal interconnections 76 connecting the MTJs 52 and metal interconnection 70 underneath, in which the metal interconnections 76 on the MRAM region 14 directly contacts the top electrodes 50 underneath while the metal interconnection 76 on the logic region 16 directly contacts the metal interconnection 70 on the lower level. Next, another stop layer 78 is formed on the IMD layer 74 to cover the metal interconnections 76.

In this embodiment, the stop layers 72 and 78 could be made of same or different materials, in which the two layers 72, 78 could all include nitrogen doped carbide (NDC), silicon nitride, silicon carbon nitride (SiCN), or combination thereof. Similar to the metal interconnections formed previously, each of the metal interconnections 76 could be formed in the IMD layer 74 through a single damascene or dual damascene process. For instance, each of the metal interconnections 76 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Overall, the present invention first forms at least a MTJ on a substrate, forming an IMD layer on the MTJ, performing an etching process to remove part of the IMD layer for forming a damaged layer directly on top of the MTJ and a trench exposing the surface of the damaged layer, and then conducting an UV curing process to slightly harden the damaged layer so that when a planarizing process is conducted afterwards to remove the damaged layer and the surrounding IMD layer it would be desirable to prevent collapse of the damaged layer and ensure no major step height is created between top surface of the IMD layer on the MRAM region and logic region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    forming a magnetic tunneling junction (MTJ) on a substrate and a top electrode on the MTJ;
    forming a first inter-metal dielectric (IMD) layer on the MTJ;
    removing part of the first IMD layer to form a damaged layer in the first IMD layer and a trench exposing the damaged layer on the MTJ, wherein a bottom surface of the damaged layer directly contacting the first IMD layer at a bottom of the trench is higher than a top surface of the top electrode; and
    performing a ultraviolet (UV) curing process.

2. The method of claim 1, wherein the substrate comprises a MRAM region and a logic region, the method further comprising:
    forming a second inter-metal dielectric (IMD) layer on the substrate;
    forming a first metal interconnection on the MRAM region and a second metal interconnection on the logic region;
    forming the MTJ on the first metal interconnection;
    forming a cap layer on the MTJ; and
    forming the first IMD layer on the cap layer.

3. The method of claim 2, further comprising:
    forming a reflective layer on the first IMD layer;
    removing the reflective layer and the first IMD layer to form the trench.

4. The method of claim 2, wherein a top surface of the first IMD layer on the logic region is lower than a top surface of the first IMD layer on the MRAM region.

5. The method of claim 1, further comprising performing the UV curing process on the damaged layer.

6. The method of claim 1, further comprising planarizing the first IMD layer after performing the UV curing process.

* * * * *